(12) United States Patent
Clark et al.

(10) Patent No.: US 9,974,205 B1
(45) Date of Patent: May 15, 2018

(54) CABLE MANAGEMENT BRACKET WITH SIDE CLAMPS

(71) Applicant: International Business Machines Corporation, Armonk, NY (US)

(72) Inventors: Mark G. Clark, Rochester, MN (US); Kenneth E. Lubahn, Oronoco, MN (US); Justin C. Rogers, Rochester, MN (US); Sandra J. Shirk/Heath, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/625,073

(22) Filed: Jun. 16, 2017

(51) Int. Cl.
*H05K 7/00* (2006.01)
*H05K 7/14* (2006.01)

(52) U.S. Cl.
CPC .................................. *H05K 7/1491* (2013.01)

(58) Field of Classification Search
CPC .................................................... G02B 6/4452
USPC ..................................................... 361/679.21
See application file for complete search history.

(56) References Cited

U.S. PATENT DOCUMENTS

| | | | |
|---|---|---|---|
| 2008/0175552 A1* | 7/2008 | Smrha | G02B 6/4452 385/135 |
| 2009/0266607 A1 | 10/2009 | Hoffer et al. | |
| 2011/0211329 A1 | 9/2011 | Dean, Jr. et al. | |
| 2014/0153186 A1 | 6/2014 | Liu et al. | |
| 2015/0181747 A1* | 6/2015 | Bailey | H05K 7/20736 361/679.48 |
| 2016/0128224 A1 | 5/2016 | Bharucha et al. | |

FOREIGN PATENT DOCUMENTS

| | | |
|---|---|---|
| EP | 1700539 A2 | 9/2006 |
| WO | 2010144144 A | 12/2010 |
| WO | 2016018344 A1 | 2/2016 |

OTHER PUBLICATIONS

Space Saving Cable Management Rack Systems, Panduit Corp., 2016, 20 pp., viewed at http://www.panduit.com/heiler/Brochures/D-RKCB25-SA-ENG-SpaceSaving-W.pdf.
"Applying Proper Cable Management in IT Racks—A Guide for Planning, Deployment and Growth", Integrated Cabinet Solutions for Business-Critical Continuity, Emerson Network Power, 2012, 12 pp.

* cited by examiner

*Primary Examiner* — Jerry Wu
(74) *Attorney, Agent, or Firm* — Patterson + Sheridan, LLP

(57) ABSTRACT

An apparatus for securing cables in a computer rack is provided. The apparatus includes a bracket attachable to one of a computer chassis arranged in the computer rack or a vertical structural member of the computer rack, and including an outward-facing surface and a first connector feature arranged on the outward-facing surface. The apparatus also includes a cable clamp. The cable clamp includes a base having a first side and an opposing second side. The first side includes a surface configured to receive cables. The second side includes a second connector feature configured for mating engagement with the first connector feature such that the base is attached to the bracket when the first and second connector features are matingly engaged. The cable clamp also includes a pliable retention strap attached to the base and configured to be wrapped around the cables such that the cables are secured to the base.

16 Claims, 5 Drawing Sheets

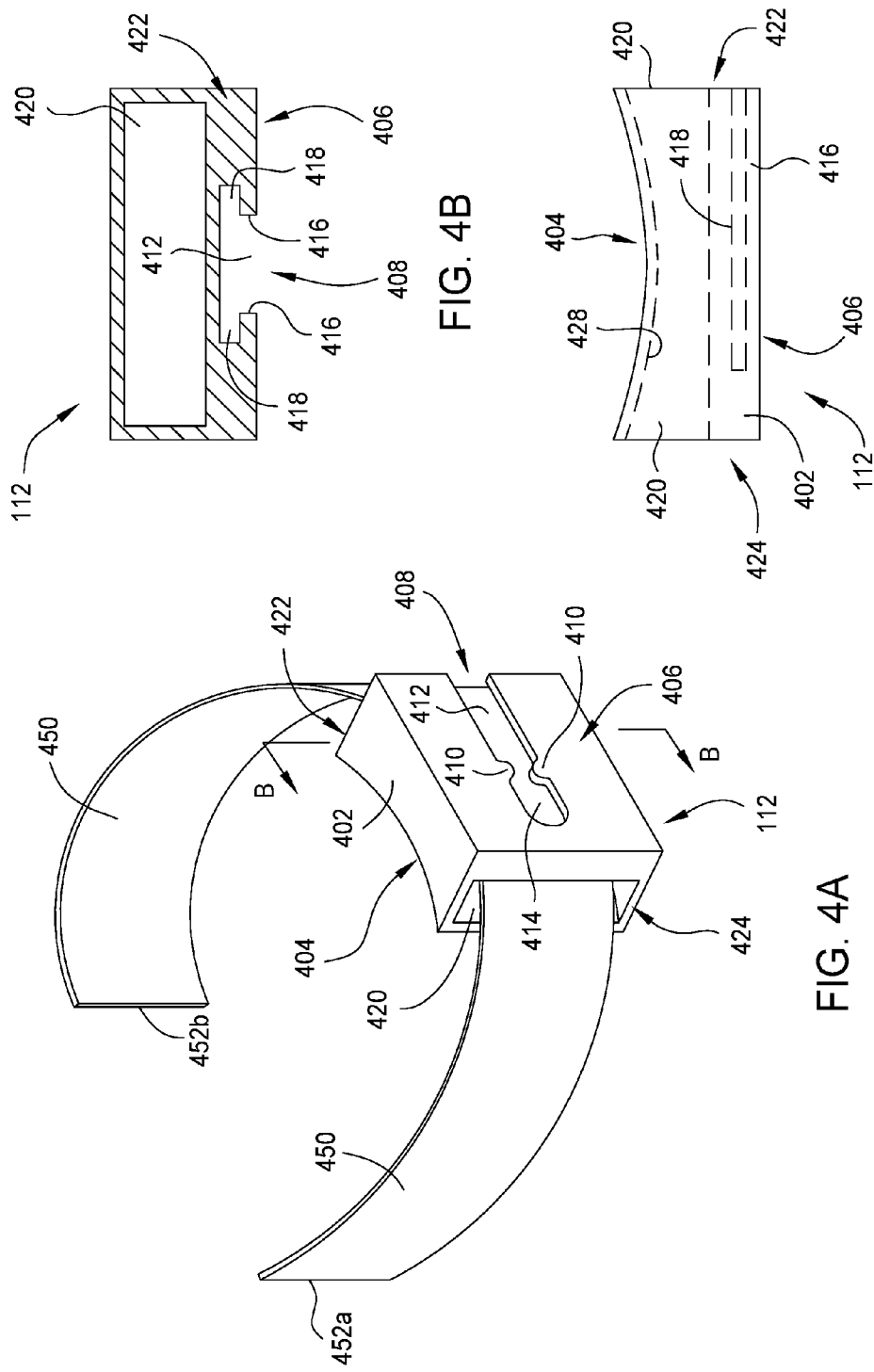

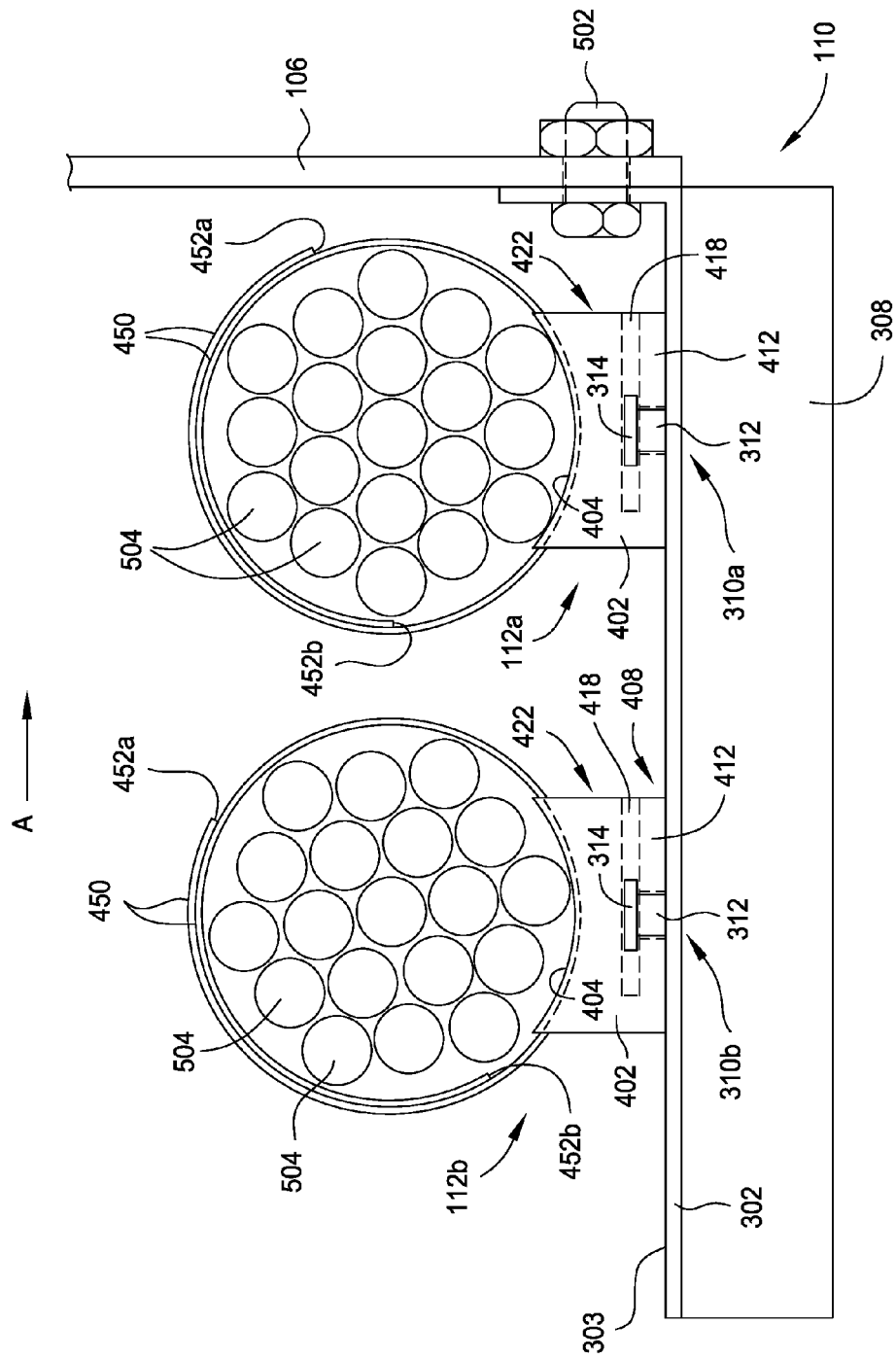

CABLE MANAGEMENT BRACKET WITH SIDE CLAMPS

BACKGROUND

The present invention relates to computer cable management, and more specifically, to cable management in a computer rack.

Computer systems are sometimes housed in computer racks, in which multiple computer chassis are connected to vertical structural members of a computer rack. Large computer centers typically have tens or hundreds of computer racks, and the computers installed in the racks communicate with each other via cables. Managing the layout of the cables to the respective computer chassis installed in the computer racks is an important consideration. An organized arrangement of cables make it easier for a technician to identify a particular cable at a later time (e.g., to replace the cable). Additionally, an organized arrangement of cables in a computer rack can provide better airflow pathways through the computer rack than a haphazard arrangement of cables.

Computer racks typically extend past a rear side of computer chassis contained therein. The computer rack typically includes interior walls with various holes, slots, tabs, or other attachment features that can be used to secure cables within the computer rack. For example, a technician may secure cables within the computer rack by passing a cable tie or a strap with hook and loop fasteners through holes in an interior wall of the computer chassis, pulling the cables to the cable tie or strap, and tightening the cable tie or strap while holding the cables in place.

SUMMARY

According to one embodiment of the present invention,

BRIEF DESCRIPTION OF THE SEVERAL VIEWS OF THE DRAWINGS

FIG. 4A is a perspective view of a cable clamp for securing data cables, according to one embodiment;

FIG. 4B is an end view of the cable clamp of FIG. 4A, wherein a retention strap illustrated in FIG. 4A is omitted for clarity;

FIG. 4C is a side view of the cable clamp of FIG. 4A, wherein the retention strap illustrated in FIG. 4A is omitted for clarity; and FIG. 5 is a top view of two cable clamps of FIGS. 4A-4C attached to a bracket of FIGS. 3A and 3B, wherein the cable clamps are securing respective bundles of cables.

DETAILED DESCRIPTION

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In embodiments described herein, cables from a computer chassis in a computer rack are bundled together with a cable clamp. The cable clamp includes a cable tie (e.g., a zip tie) or strap with hook and loop fasteners that secure the cables to a body of the cable clamp. The cable clamp, with the cables secured thereto, is connectable to a bracket. The bracket is attached to a vertical structural member of a computer rack or to a computer chassis within the computer rack. By connecting the bracket to the vertical structural member of the computer rack or to a computer chassis within the computer rack, the position of the bracket relative to the computer rack, and the computer clamps attachable to the bracket, can be customized for the particular arrangement of computer chassis within the computer rack. Additionally, since the cables are secured to the cable clamp before the cable clamp is connected to the bracket, the step of bundling the cables is decoupled from the step of securing the cables within the computer rack.

Figure 1:
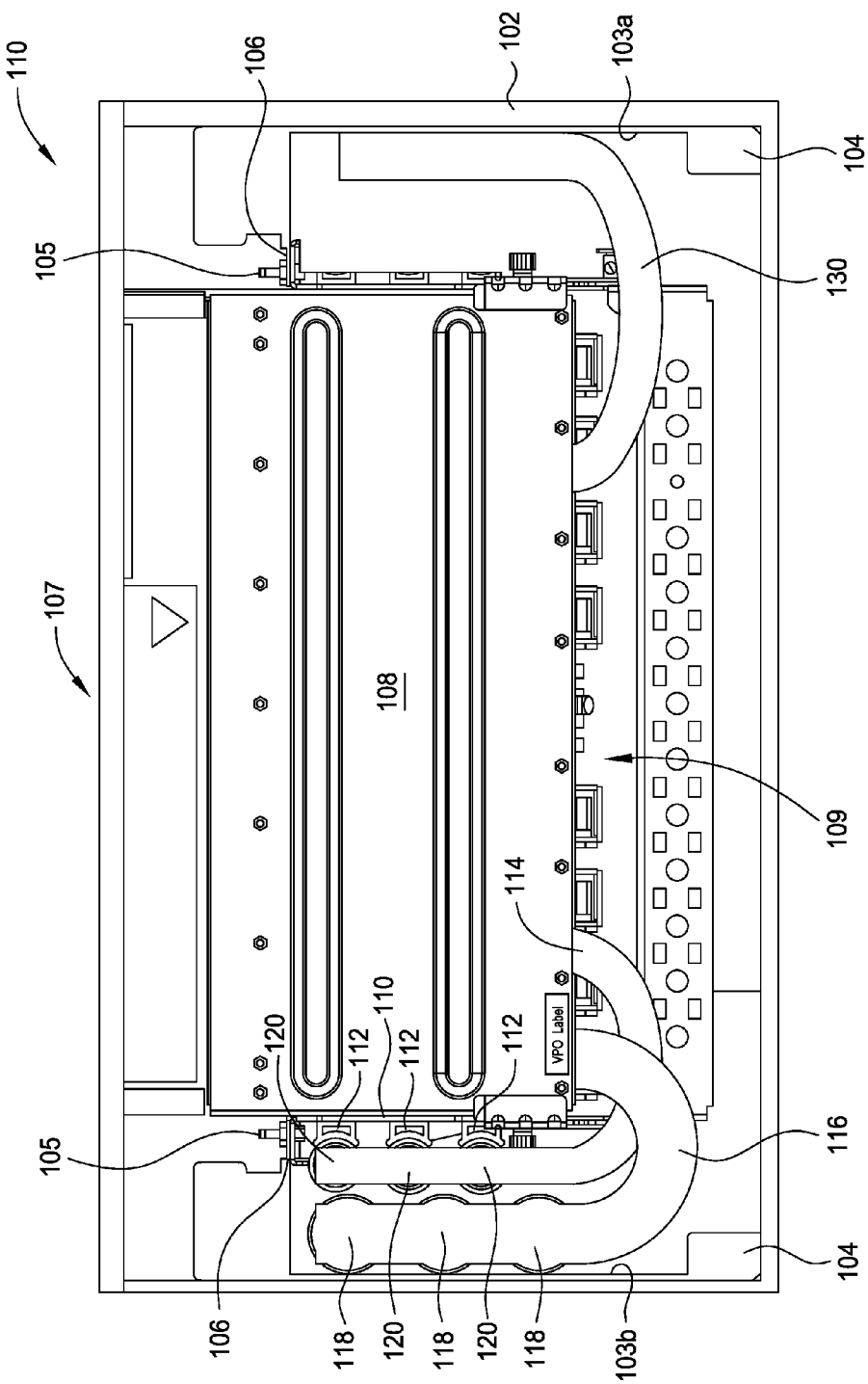
FIG. 1 is a top schematic view of a computer rack with computer chassis inside, wherein data cables on a right-hand side of the Figure are depicted in a first arrangement of cables in the computer rack and data cables on a left-hand side of the Figure are depicted in a second arrangement of cables in the computer rack.
Figure 2:
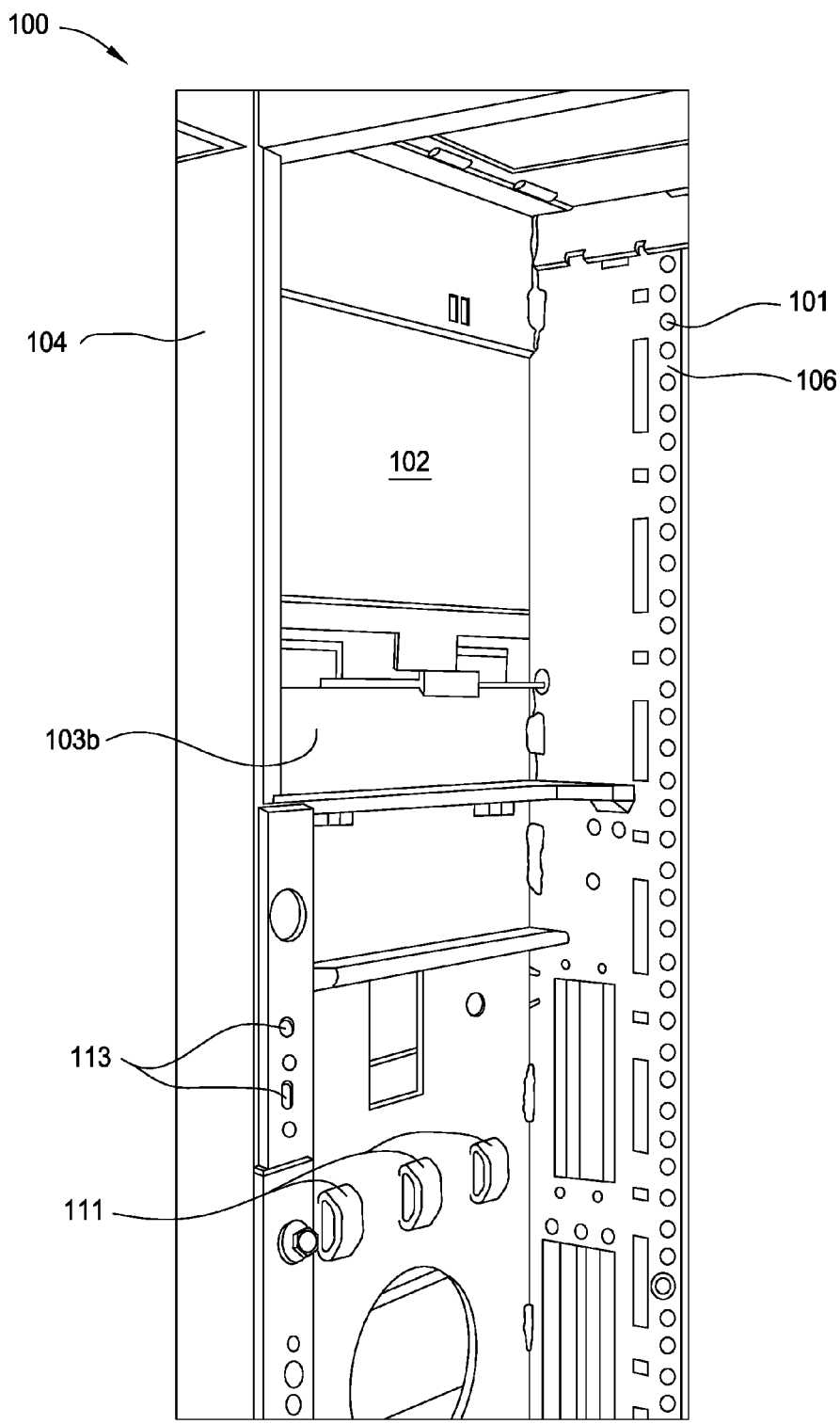
FIG. 2 is a perspective rear view of an exemplary computer rack.

FIG. 1 is a top schematic view of a computer chassis 108 installed in a computer rack 100 and FIG. 2 is a rear perspective view of the computer rack 100. An exterior frame 102 of the computer rack 100 includes corner posts 104. The rearmost corner posts 104 of the computer rack 100 are illustrated in FIGS. 1 and 2. The computer chassis 108 is attached to vertical structural members 106 of the computer rack 100. The vertical structural members 106 extend inwardly from an exterior frame 102 of the computer rack 100. The vertical structural members 106 include holes 101 arranged vertically along the vertical structural members 106. The computer chassis 108 is positioned in the rack and affixed to the vertical structural members 106 by inserting fasteners 105 through holes 101 in the vertical structural members 106 and in brackets in the computer chassis 108.

The computer rack 100 includes interior walls 103a and 103b. As discussed above, the interior walls 103a and 103b may include various holes, slots, tabs, or other attachment features 111 and 113 that can be used to secure cables from the computer chassis 108 to the computer rack 100. On the right-hand side of FIG. 1, a bundle of cables 130 is illustrated as being connected to a rear 109 of the computer chassis 108 and routed to the interior wall 103a of the computer rack 100. There are several issues with the arrangement of the bundle of cables 130 connected to the interior wall 103a. First, the holes, slots, tabs, or other attachment features 111 and 113 of the interior wall 103a may not be properly positioned for use by a computer chassis 108 based on the vertical placement of the computer chassis 108 within the computer rack 100. For example, the holes, slots, tabs, or other attachment features 111 and 113 of the interior wall 103a may be located at a higher or lower location in the computer rack 100 than the computer chassis 108. Second, as shown in FIG. 1, the bundle of cables 130 extends from a rear 109 of the computer chassis 108 over to the interior wall 103a. Access to a space between the computer chassis 108 and the interior wall 103a may be blocked by the bundle of cables 130 passing over that space. Finally, to span the distance from the rear 109 of the computer chassis 108 to the interior wall 103a, a longer cable is needed than is needed to route cables from the computer chassis 108 to a position immediately outboard of the computer chassis 108. Such longer cables are more expensive and have lesser electrical performance than shorter cables.

On the left-hand side of FIG. 1, a bundle of cables 114 is illustrated as being connected to the rear 109 of the computer chassis and secured to a bracket 110 via a plurality of cable clamps 112. Specifically, in the illustrated embodiment, each of the cable clamps 112 includes a portion 120 of the bundle of cables 114, and the portions 120 are directed in a vertical direction (i.e., in/out of the page as viewed in FIG. 1). The bracket 110 is connected to the computer chassis 108 or to the vertical structural member 106 at the same location as the computer chassis or immediately above or below the computer chassis 108 in the computer rack 100. For example, the computer chassis 108 is illustrated as being attached to the vertical structural member 106 via the fasteners 105, and the bracket 110 could be attached to the vertical structural member 106 via the same fasteners 105. The bundle of cables 114 on the left-hand side of FIG. 1 remain close to the computer chassis 108, resulting in space along the interior wall 103b being available for an additional bundle of cables 116 (e.g., input/output cables). The additional bundle of cables 116 is illustrated in FIG. 1 as being attached as three portions 118 attached to the interior wall 103b. Additionally, the bundle of cables 114 on the left-hand side of FIG. 1 are shorter than the bundle of cables 130 on the right-hand side of FIG. 1 because the bundle of cables 114 on the left-hand side is closer to the computer chassis 108. Finally, since the bracket 110 and cable clamps 112 are vertically co-located with the computer chassis 108 in the computer rack 100, the bracket 110 and clamps 112 are better positioned for managing the bundle of cables 114 in an organized manner.

Figure 3B:
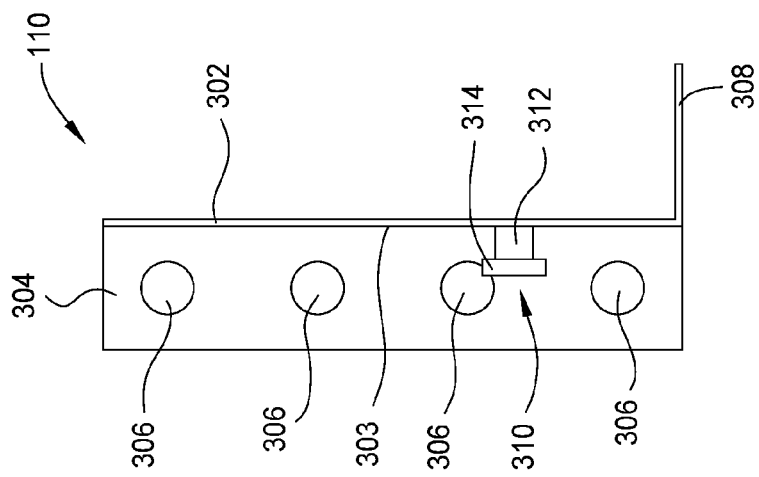
FIG. 3B is an end view of the bracket of FIG. 3A.
Figure 3A:
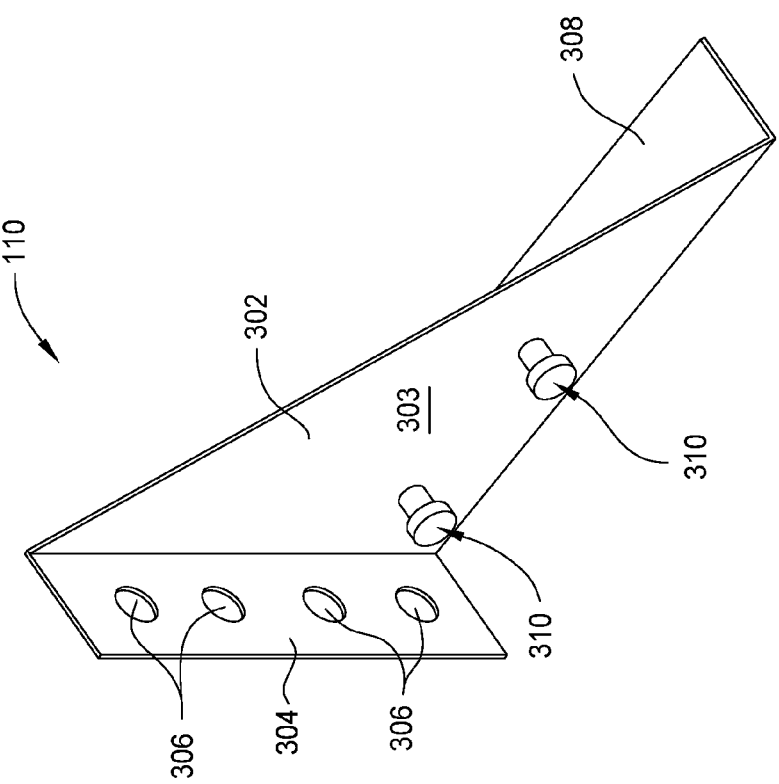
FIG. 3A is a perspective view of a bracket, according to one embodiment, for securing data cables.

FIGS. 3A and 3B are a perspective view and an end view of the bracket 110 shown in FIG. 1. The bracket 110 includes a support 302 extending from a mounting plate 304. In the illustrated embodiment, the support 302 extends from the mounting plate 304 at a 90° angle. The mounting plate 304 includes a plurality of mounting holes 306. Respective ones of the mounting holes 306 can be aligned with one or more of the holes 101 in the vertical support members 106 such that the fasteners 105 can pass through the hole(s) 101 in the vertical support member 106 and the hole(s) 306 in the mounting plate 304. Alternatively, the mounting holes 306 could be aligned with one or more holes in an additional mounting bracket on the computer chassis 108. Optionally, the bracket 110 can include a stiffening member 308 arranged along an edge of the support 302. The stiffening member 308 reduces possible deflection of the support 302. In the illustrated embodiment shown in FIGS. 1, 3A, and 3B, the stiffening member 308 is oriented to extend from the support 302 toward the computer chassis 108 when the computer chassis 108 and the bracket 110 are installed in the computer rack 100. In such embodiments, the bracket 110 is attached to the computer rack 100 or the computer chassis 108 such that the stiffening member 308 may be positioned below or above the computer chassis 108.

The support 302 for the bracket 110 includes an outward-facing surface 303 with one or more first connector features 310 arranged thereon. As will be described in more detail below, cable clamps can be attached to the first connector features 310 to secure the cable clamps to the bracket 110. The embodiments of the bracket 110 illustrated in FIGS. 3A and 3B includes two first connector features 310. In other embodiments, a bracket 110 may include a single first connector feature 310 or more than two first connector features 310. Referring primarily to FIG. 3B, in at least one embodiment, the first connector features 310 are T-shaped standoffs that include a post 312 protruding from the outward-facing surface 303 of the support 302 and a cap 314 connected to the post 312.

FIGS. 4A-4C are a perspective view, an end view, and a side view, respectively, of the cable clamp 112 of FIG. 1, which is configured to secure a bundle of cables and also to be connected to the connector features 310 of the bracket 110 illustrated in FIGS. 3A and 3B. The cable clamp 112 includes a base 402 having a first side 404 and an opposing second side 406. In one embodiment, the base 402 comprises a plastic or polymer material, such as nylon or phenolic. In various embodiments, the material comprising the base 402 is non-flammable. The first side 404 is configured to receive cables. In the illustrated embodiment, the first side 404 includes a concave surface such that cables pressed against the first side 404 are urged toward a center position of the first side 404 between a first end 422 and a second end 424. The second side 406 of the base 402 includes a second connector feature 408 configured for mating engagement with a first connector feature 310 of the bracket 110. In the illustrated embodiment depicted in FIGS. 4A-4C, the second connector feature 408 comprises a T-shaped slot 412 having a cross-sectional profile matching the post 312 and the cap 314 of the T-shaped standoffs 310 on the bracket 110. Referring primarily to FIG. 4B, the T-shaped slot 412 is open to the first end 422 of the base 402 and includes first opposing walls 416, which are spaced apart to accommodate the post 312 of a T-shaped standoff 310, and second opposing walls 418, which are spaced apart to accommodate the cap 314 of the T-shaped standoff 310.

In at least one embodiment, the T-shaped slot 412 includes detents configured to retain the T-shaped standoff 310 in the T-shaped slot 412. Referring primarily to FIG. 4A, the first opposing walls 412 are illustrated as including detents 410, which define a region in which the first opposing walls 412 are spaced closer together than remaining portions of the first opposing walls 412. The detents 410 are spaced closer together than an exterior dimension of the post 312 such that a certain amount of force must be applied to the base 402 to push the detents 410 past the post 312 of the T-shaped standoff 310 during installation such that the post 312 of the T-shaped standoff 310 is retained at an end 414 of the T-shaped slot 412. The certain amount of force must also be applied to the base 410 to again push the detents 410 past the post 312 to remove the T-shaped slot 412 from the T-shaped post 310. The dimensions of the detents 410 can be selected based on the dimensions of the post 312 of the T-shaped standoff 310 and a desired amount of force to push the detents 410 past the post 312. In one embodiment, the desired amount of force is between 5 pounds and 10 pounds of force. In other embodiments, more or less force may be desired. At least one embodiment, the desired amount of force is an amount of force greater than an amount of force applied by cables secured by the cable clamp 112 when the cable clamp 112 is installed on the bracket 110 such that the cable clamp 112 does not come loose from the bracket 110 unintentionally.

The base 402 also includes a channel 420 between the first end 422 and the second end 424. The channel 420 accommodates a pliable retention strap 450 there-through. As used herein, a retention strap is pliable if it is flexible and easily conformable around a bundle of cables. In one embodiment, the pliable retention strap 450 is a cable tie (also known as a hose tie, zap strap, or cable tie). In another embodiment, the pliable retention strap 450 is a fabric strap with hook and loop fasteners (e.g., Velcro®) arranged thereon. Referring primarily to FIG. 4A, a bundle of cables (e.g., a portion 120 of the bundle of cables 114) can be passed between free ends 452a and 452b of the pliable retention strap 450 and placed against the first side 404 of the base 402. Thereafter, the pliable retention strap 450 can be manipulated around the bundle of cables and secured to itself and/or tightened. For example, in aspects in which the pliable retention strap 450 is a cable tie, the first end 452a of the pliable retention strap is inserted through the second end 452b, which includes a ratchet pawl such that the first end 452a does not come undone. The first end 452a of the pliable retention strap is pulled through the second end 452b until the pliable retention strap 450 is arranged snugly around the bundle of cables therein. As another example, in aspects in which the pliable retention strap 450 includes hook and loop fasteners, the first end 452a of the pliable retention strap 450 overlaps the second end 452b of the pliable retention strap 450 such that a strip of loops arranged on an inward-facing surface of the first end 452a of the pliable retention strap 450 engage a strip of hooks arranged on an outward-facing surface of the second end 452b of the pliable retention strap 450. Alternatively, the inward-facing surface of the first end 452a of the pliable retention strap 450 may include the strip of hooks and the outward-facing surface of the second end 452b may include the strip of loops. The first and second ends 452a and 452b of the pliable retention strap 450 are manipulated to overlap such that the pliable retention strap 450 is arranged snugly around the bundle of cables therein.

Referring primarily to FIG. 4C, in at least one embodiment, the channel 420 in the base 402 includes an arcuate surface 428 disposed toward the first side 404 of the base 402. The arcuate surface 428 allows the pliable retention strap 450 to smoothly curve through the channel 420. Such curvature of the pliable retention strap 450 may reduce sharp bends in the pliable retention strap 450, which could cause fraying and/or cracking of the pliable retention strap 450.

FIG. 5 is a top view of the bracket 110 attached to the vertical support member 106 of the computer rack 100. The bracket 110 is attached to the vertical support member 106 with a fastener (e.g., the fastener 105) depicted as a nut and bolt 502 that is passing through a hole 306 in the bracket 110 and a hole 101 in the vertical support member 106. Two cable clamps 112a and 112b support respective bundles of cables and are attached to respective connector features 310 on the outward-facing surface 303 on the support 302 of the bracket 110. To secure a bundle of wires to the bracket 110, the bundles of wires are secured to respective ones of the cable clamps 112a and 112b via the pliable retention straps 450. FIG. 5 illustrates a first bundle of cables 504 secured by the pliable retention strap 450 of the first cable clamp 112a and a second bundle of cables 504 secured by the pliable retention strap 450 of the second cable clamp 112b. The first bundle of cables 504, secured by the first cable clamp 112a, includes fewer cables 504 then the second bundle of cables 504, secured by the second cable clamp 112b. As a result, the ends 452a and 452b of the pliable retention strap 450 for the first cable clamp 112a overlap to a greater degree than the ends 452a and 452b of the pliable retention strap 450 for the first cable clamp 112b.

After the bundles of cables 504 are secured in the respective pliable retention straps 450, the cable clamps 112 are attached to the T-shaped standoffs 310 on the outward-facing surface 303 of the support 302 of the bracket 110. Specifically, the first cable clamp 112a is positioned relative to the outward-facing surface 303 of the bracket 110 such that the opening for the T-shaped slot 412 in the first end 422 of the base 402 is aligned with the first T-shaped standoffs 310a. Thereafter, the first cable clamp 112a is slid along the outward-facing surface 303 in the direction of arrow A, such that the first T-shaped standoffs 310a is engaged with the T-shaped slot 412. As discussed above, in one embodiment, the T-shaped standoffs 310a is engaged with the T-shaped slot 412 after the post 312 of the T-shaped standoffs 310a has passed the detents 410 of the T-shaped slot 412. After the first cable clamp 112a is secured to the bracket 110 via the first T-shaped standoff 310a, the second cable clamp 112b is secured to the second T-shaped standoff 310b in a similar manner.

As discussed above, the cables 504 are secured in the respective cable clamps 112a and 112b before the cable clamps 112a and 112b are attached to the bracket 110. As a result, the technician or other person installing the cables 504 can use two hands to apply the pliable retention strap 450 around a bundle of cables 504, ensuring that the pliable retention strap 450 is applied with a suitable amount of tension. If too little tension is applied to the pliable retention strap 450, then the cables 504 secured by the pliable retention strap 450 may move too much within the computer rack 100. Alternatively, if too much tension is applied to the pliable retention strap 450, then the cables 504 may be damaged by the pliable retention strap 450. Allowing the technician to use both hands to secure the bundle of cables 504 with the pliable retention strap 450 facilitates proper tensioning of the pliable retention strap 450. Additionally, by securing the bundles of cables 504 to the bracket 110 via the cable clamps 112, the bundles of cables 504 are positioned close to a computer chassis 108 in which the cables 504 terminate.

While the foregoing is directed to embodiments of the present invention, other and further embodiments of the invention may be devised without departing from the basic scope thereof, and the scope thereof is determined by the claims that follow.

What is claimed is:

1. A system for securing cables in a computer rack, comprising: a bracket selectively attachable to one of a computer chassis arranged in the computer rack or a structural member of the computer rack, wherein the bracket includes an outward-facing surface and a first connector feature arranged on the outward-facing surface; and a cable clamp, comprising: a base having a first side and a second side, wherein the first side of the base includes a surface configured to receive cables, and wherein the second side of the base includes a second connector feature configured for mating engagement with the first connector feature such that the base is attached to the bracket when the first and second connector features are matingly engaged; and a pliable retention strap secured to the base and configured to be secured around the cables such that the cables are secured to the base; and a T-shaped stand-off extending from the outward-facing surface of the bracket, and wherein the second connector feature comprises a T-shaped slot configured to retain the T-shaped stand-off by a detent.

2. The system of claim 1, wherein the first connector feature comprises a plurality of first connector features, and further comprising a plurality of cable clamps, wherein second connectors features of the plurality of cable clamps are configured for mating engagement with respective ones of the plurality of first connector features.

3. The system of claim 1, wherein the retention strap comprises hook and loop fasteners to secure retention strap around the cables.

4. The system of claim 1, wherein the retention strap comprises a cable tie.

5. The system of claim 1, wherein the base comprises a non-flammable material.

6. A computer rack, comprising: structural members configured to support a plurality of computer chassis; a plurality of brackets respectively attached to one of a computer chassis arranged in the computer rack or a structural member of the computer rack, wherein each of the brackets includes an outward-facing surface and a first connector feature arranged on the outward-facing surface; a plurality of cable clamps attached to respective brackets, each cable clamp comprising: a base having a first side and a second side, wherein the first side of the base includes a surface configured to receive cables, and wherein the second side of the base includes a second connector feature configured for mating engagement with the first connector feature such that the base is attached to the bracket when the first and second connector features are matingly engaged; and a pliable retention strap attached to the base and configured to be secured around the cables such that the cables are secured to the base; and a T-shaped stand-off extending from the outward-facing surface of the bracket, and wherein the second connector feature comprises a T-shaped slot configured to retain the T-shaped stand-off by a detent.

7. The system of claim 6, wherein the first connector feature comprises a plurality of first connector features, and further comprising a plurality of cable clamps, wherein second connectors features of the plurality of cable clamps are configured for mating engagement with respective ones of the plurality of first connector features.

8. The system of claim 6, wherein the retention strap comprises hook and loop fasteners to secure retention strap around the cables.

9. The system of claim 6, wherein the retention strap comprises a cable tie.

10. The system of claim 6, wherein the base comprises a non-flammable material.

11. A method for securing cables in a computer rack, comprising: attaching a bracket to one of a structural member of the computer rack or a computer chassis in the computer rack, the bracket comprising an outward-facing surface and a first connector feature arranged on the outward-facing surface; securing a bundle of cables to a cable clamp, wherein the cable clamp comprises: a base having a first side and a second side, wherein the first side of the base includes a surface configured to receive cables, and wherein the second side of the base includes a second connector feature configured for mating engagement with the first connector feature such that the base is attached to the bracket when the first and second connector features are matingly engaged; and a pliable retention strap attached to the base, wherein securing the bundle of cables to the cable clamp comprises wrapping the pliable retention strap around the bundle of cables; and securing the cable clamp with the secured bundle of cables to the bracket by mating the second connector feature of the base to the first connector feature of the bracket; and a T-shaped stand-off extending from the outward-facing surface of the bracket, and wherein the second connector feature comprises a T-shaped slot configured to retain the T-shaped stand-off by a detent.

12. The method of claim 1, wherein the first connector feature comprises a T-shaped stand-off extending from the outward-facing surface of the bracket, wherein the second connector feature comprises a T-shaped slot configured to receive the T-shaped stand-off, and wherein mating the second connector feature of the base to the first connector feature of the bracket comprising sliding the T-shaped slot over the T-shaped stand-off.

13. The method of claim 12, wherein the T-shaped slot includes a detent configured to retain the T-shaped stand-off in the slot, and wherein sliding the T-shaped slot over the T-shaped stand-off comprises exerting sufficient force on the base of the cable clamp that the T-shaped stand-off passes the detent of the T-shaped slot.

14. The method of claim 11, wherein wrapping the retention strap around the bundle of cables comprises setting a target tension level of the retention strap.

15. The method of claim 11, further comprising disposing a second plurality of cables in a space between the plurality of cables secured to the bracket via the cable clamp and a wall of the computer rack.

16. The method of claim 11, wherein the bracket comprises a plurality of first connector features, and wherein securing the cable clamp with the secured bundle of cables to the bracket by mating the second connector feature of the base to the first connector feature of the bracket comprises mating the second connector feature of the base to a first one of the plurality of first connector features, and further comprising:
   securing a second bundle of cables to a second cable clamp, wherein the second cable clamp comprises:
      a second base having a third side and a fourth side, wherein the third side of the base includes a surface configured to receive cables, and wherein the fourth side of the base includes a second connector feature configured for mating engagement with a first connector feature such that the second base is attached to the bracket when the first and second connector features are matingly engaged; and
      a second pliable retention strap attached to the base, wherein securing the second bundle of cables to the second cable clamp comprises wrapping the second pliable retention strap around the second bundle of cables; and
securing the second cable clamp with the secured second bundle of cables to the bracket by mating the second connector feature of the base to a second one of the plurality of first connector features of the bracket.

* * * * *